US008604589B2

(12) United States Patent
Tsukamoto et al.

(10) Patent No.: US 8,604,589 B2
(45) Date of Patent: Dec. 10, 2013

(54) SEMICONDUCTOR DEVICE OF POLYCRYSTALLINE SILICON RESISTORS

(75) Inventors: Akiko Tsukamoto, Chiba (JP); Hirofumi Harada, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 11/494,310

(22) Filed: Jul. 26, 2006

(65) Prior Publication Data

US 2007/0023844 A1    Feb. 1, 2007

(30) Foreign Application Priority Data

Jul. 29, 2005    (JP) .................................. 2005-220982

(51) Int. Cl.
   *H01L 21/02*    (2006.01)
(52) U.S. Cl.
   USPC ..... 257/538; 257/380; 257/536; 257/E27.116
(58) Field of Classification Search
   USPC .......................................... 257/538, E27.116
   See application file for complete search history.

(56) References Cited

U.S. PATENT DOCUMENTS

| 5,296,726 A * | 3/1994 | MacElwee ..................... 257/213 |
| 2002/0047183 A1 * | 4/2002 | Shiiki et al. ..................... 257/538 |

FOREIGN PATENT DOCUMENTS

| CN | 1340829 A | | 3/2002 |
| JP | 02069972 A | * | 3/1990 |
| JP | 2002-076281 | | 3/2002 |

OTHER PUBLICATIONS

Office Action from counterpart Chinese Application No. 200610128558.3, dated Mar. 27, 2009, 6 pages.

* cited by examiner

*Primary Examiner* — Hsin-Yi Hsieh
(74) *Attorney, Agent, or Firm* — Brinks Gilson & Lione

(57) ABSTRACT

Provided is a method capable of forming a polycrystalline silicon resistor with preferable ratio accuracy so as to design a resistor circuit with high accuracy. In the method, a length of a low concentration impurity region constituting the polycrystalline silicon resistor in a longitudinal direction is varied in accordance with an occupying area of a metal portion overlapping the low concentration impurity region, thereby correcting a variation in resistance without varying an external shape and the occupying area of the resistor.

12 Claims, 3 Drawing Sheets

SEMICONDUCTOR DEVICE OF POLYCRYSTALLINE SILICON RESISTORS

This application claims priority under 35 U.S.C. §119 to Japanese Patent Application No. 2005-220982 filed Jul. 29, 2005, the entire content of which is hereby incorporated by reference.

BACKGROUND OF THE INVENTION

1. Field of the Invention

The present invention relates to a semiconductor device including a resistor made of polycrystalline silicon.

2. Description of the Related Art

In a semiconductor integrated circuit, a diffused resistor or a polycrystalline silicon resistor is used. The diffused resistor is made from a single crystalline silicon semiconductor substrate into which impurities of an opposite conductivity type to that of the semiconductor substrate are implanted. The polycrystalline silicon resistor is made of polycrystalline silicon into which impurities are implanted. In particular, advantages in the polycrystalline silicon resistor such as small leakage current brought by insulating films surrounding the resistor and high resistivity obtained by defects existing at grain boundaries result in wide use in semiconductor integrated circuits.

FIGS. 2A and 2B are a schematic plan view and a schematic sectional view of a conventional polycrystalline silicon resistor circuit, respectively. The polycrystalline silicon resistor is produced by implanting a p-type or n-type impurity to a polycrystalline silicon thin film deposited on an insulating film by LPCVD or the like, and then processing the resultant into a resistor shape with a photolithography technique. Impurity implantation is performed for determining a resistivity of the polycrystalline silicon resistor. Depending on a desired resistivity, a concentration of the p-type or n-type impurity to be implanted ranges from $1\times10^{17}/cm^3$ to $1\times10^{20}/cm^3$. Further, at each terminal on both sides of the resistor, a contact hole and a metal wiring are formed to get the potential thereof. A satisfactory ohmic contact between the polycrystalline silicon and the metal wiring at the terminal requires selective implantation of impurities at a high concentration of equal to or more than $1\times10^{20}/cm^3$ are, by using a patterned photo resist, into a part of the polycrystalline silicon corresponding to the terminal of the resistor. The resistor using the polycrystalline silicon is thus structured, as shown in the schematic plan view of FIG. 2A and the schematic sectional view of FIG. 2B, the resistor includes a polycrystalline silicon 103 made of a low concentration impurity region 104 and a high concentration impurity region 105, which is formed on a insulating film 102 on a semiconductor substrate 101. Potential is obtained from a metal wiring 107 via a contact hole 106 disposed on the high concentration impurity region 105.

In order to obtain various potentials from a resistor circuit, various resistor groups are structured by connecting basic unit resistors in series or in parallel and provided with terminals for supplying the potentials. In order to stabilize a resistance for each resistor group, a metal portion is formed on the resistor group and connected to a terminal at an end of the resistor group. This structure is illustrated in FIG. 2B and there are two reasons for the structure.

The first reason is to obtain stability of the polycrystalline silicon resistor. Since polycrystalline silicon is a semiconductor, formation of a wiring or an electrode over the polycrystalline silicon causes depletion or accumulation in the polycrystalline silicon owing to a relative relationship between the potential of the wiring or the electrode and that of the polycrystalline silicon resistor, which varies a resistance of the polycrystalline silicon resistor. To be specific, existence of a wiring or an electrode having a higher potential than the polycrystalline silicon resistor made of the polycrystalline silicon into which the p-type impurity is implanted, and disposed directly above the polycrystalline silicon depletes the p-type polycrystalline silicon, which increases the resistance of the resistor. In a case of a reverse relationship in potential, the resistance reduces owing to the accumulation. Intentional formation of a wiring having a potential close to that of the polycrystalline silicon on the polycrystalline silicon enables the maintenance of a constant resistance, thus preventing the variation of the resistance. This is illustrated in the plan view of FIG. 2A as an example. In FIG. 2A, an electrode at one side of the polycrystalline silicon resistor is extended to a resistor to fix the potential. This phenomenon depends not only on the wiring above the polycrystalline silicon but of course on the wiring below the polycrystalline silicon. In other words, a relative relationship between potentials of the polycrystalline silicon resistor and a semiconductor substrate located below the polycrystalline silicon resistor varies the resistance. In view of this, there is known a method of stabilizing the potential by intentionally forming a diffusion region (not shown) or the like below the polycrystalline silicon resistor in the same manner as the above-mentioned metal wiring.

The second reason is to prevent hydrogen, which affects the resistance of the polycrystalline silicon, from diffusing into the polycrystalline silicon. The polycrystalline silicon is composed of a grain having relatively high crystallinity and a grain boundary between the grains which has low crystallinity, that is, a high interface level density. The resistance of the polycrystalline silicon resistor is mostly determined by electrons or holes, which serve as carriers, trapped by a large number of interface levels existing at the grain boundary. When hydrogen having a high diffusion coefficient is, however, generated in a semiconductor manufacturing process, the generated hydrogen easily reaches the polycrystalline silicon and becomes trapped by the interface level, thus varying the resistance. Examples of the hydrogen generating process include a sintering step in a hydrogen atmosphere after metal electrode formation and a forming step of a plasma nitride film using an ammonia gas. When the metal portion overlaps the polycrystalline silicon resistor, the variation of the resistance of the polycrystalline silicon due to the hydrogen diffusion can be suppressed.

The method of stabilizing the resistance of the polycrystalline silicon is disclosed in, for example, JP 2002-076281 A.

The method of stabilizing the resistance of the polycrystalline silicon has the following problem. That is, the metal portion on the polycrystalline silicon is susceptible to factors other than hydrogen which affect the polycrystalline silicon in the semiconductor manufacturing process, which includes heat, stress, or charging due to plasma. Therefore, those factors affect the polycrystalline silicon through the metal portion thereon, which results in the variation of the resistance. This will be explained in detail below with reference to FIG. 2A.

It is assumed that the unit resistor constituting the resistor formed with the manufacturing method mentioned in Description of the Related Art section is formed to have a constant area. In this case, when the areas of the metal portions overlapping the resistors are the same like resistor groups 1, 2, and 3 of FIG. 2A, a resistance ratio is obtained with preferable precision. However, when the metal portion is provided so as to overlap a plurality of resistors like a resistor group 4 or 5 of FIG. 2A, it is found that resistance ratio accuracy of the resistors is not constant. For example, since the resistor group 1 includes one unit resistor, and the resistor group 4 includes two unit resistors connected in series, the resistance ratio of 1:2 should accordingly be obtained. However, the desired resistance ratio can not obtained in many cases and the resistance ratio of, for example, 1:1.7 is obtained.

SUMMARY OF THE INVENTION

The present invention has been made to solve the above-mentioned problem and to provide a method of manufacturing a polycrystalline silicon resistor having more accurate ratio than a conventional method.

According to the present invention, there is provided a semiconductor device including: a semiconductor substrate; a first insulating film formed on the semiconductor substrate; a plurality of resistors having an identical shape which is provided on the first insulating film and includes polycrystalline silicon having a low concentration impurity region and a high concentration impurity region; a second insulating film formed on the plurality of the resistors; a contact hole formed through the second insulating film and located above the high concentration impurity region; a metal wiring connected to the contact hole, for connecting the plurality of resistors including polycrystalline silicon; and a metal portion provided above the second insulating film while covering the low concentration impurity region of each resistor group, the resistor group being made of one of a single resistor and at least two resistors connected to one another, in which a length of the low concentration impurity region in a longitudinal direction is calculated based on a proportional relationship between a resistance and an area of the metal portion.

According to the present invention, the resistance ratio of the semiconductor device is made accurate, which enables the formation of the polycrystalline silicon resistors having more stable resistance ratio. Further, adoption of a resistor circuit according to the present invention makes it possible to suppress a relative accuracy to be equal to or less than 0.5%, depending on a structure of the resistor circuit. In addition, there is no need to change a layout of constituents other than the low concentration impurity region, which prevents increase in manufacturing cost due to adoption of the present.

DETAILED DESCRIPTION OF THE PREFERRED EMBODIMENT

Hereinafter, an embodiment mode of the present invention will be described with reference to the drawings.

Figure 1A:
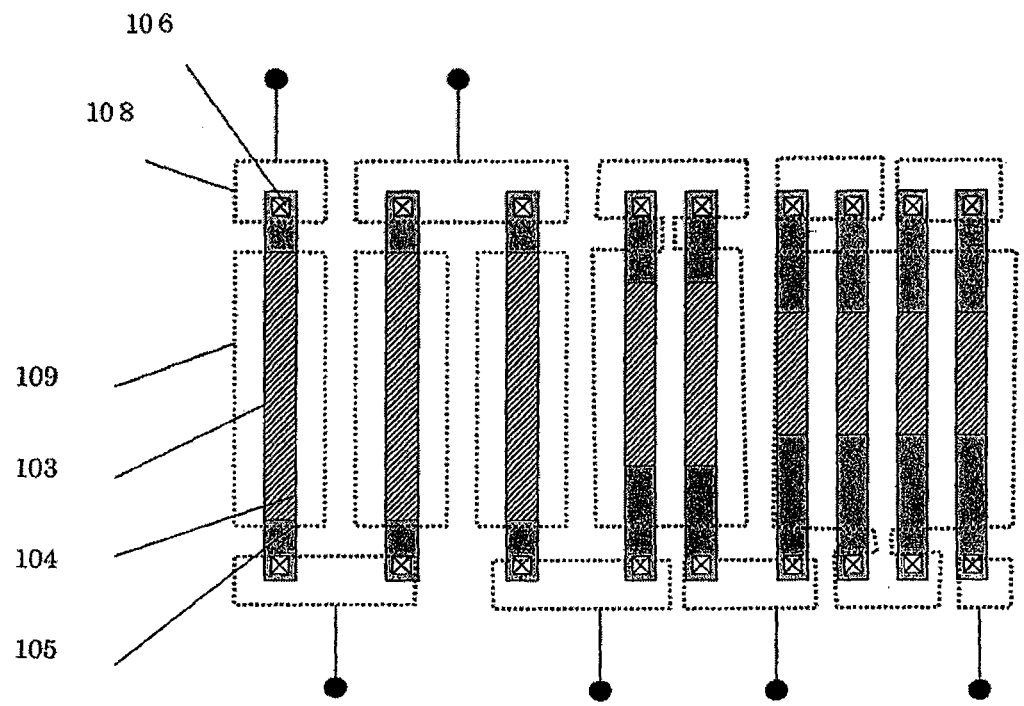
FIG. 1A is a schematic plan view of a first embodiment.

FIG. 1A shows a polycrystalline silicon resistor formed in a semiconductor device according to a first embodiment. As in a conventional case, a resistor made of polycrystalline silicon 103 composed of a low concentration impurity region 104 and a high concentration impurity region 105, which is formed on an insulating film on a semiconductor substrate.

Through a contact hole 106 provided on the high concentration impurity region 105, a potential is obtained with a metal wiring formed of a first metal portion 108. Further, the polycrystalline silicon 103 is overlapped with a second metal portion 109. In this case, the second metal portion 109 covering only a unit resistor is not connected to anywhere. Herein, according to the present invention, a resistance ratio deviation of a resistor from a preferable resistance ratio which is caused by laying out a semiconductor device with a conventional technique is corrected by increasing/decreasing an area of a low concentration impurity region as described below.

Figure 1B:
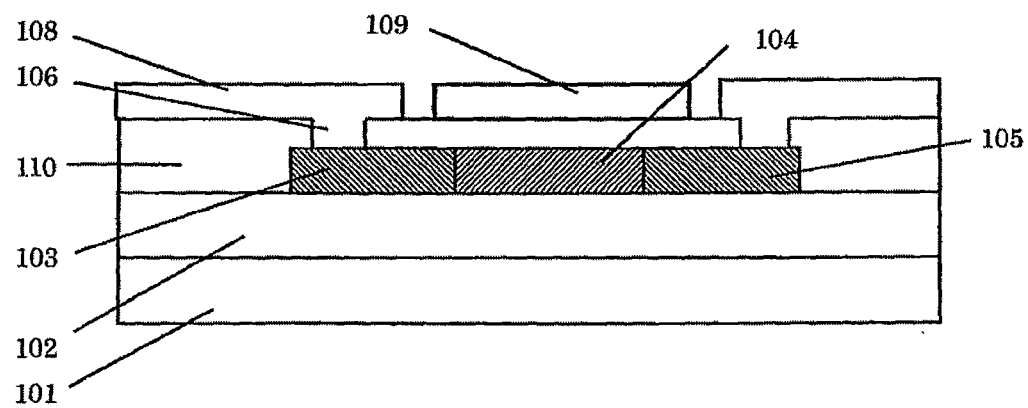
FIG. 1B is a schematic sectional view of the first embodiment.

FIG. 1B is a schematic sectional view of the first embodiment. FIG. 1B includes a second insulating film 110.

As mentioned in the description of the conventional technique, examples of factors which influence a metal portion during a semiconductor manufacturing process include, other than hydrogen, heat, stress, and a charge due to plasma, by which the polycrystalline silicon in the semiconductor manufacturing process is affected. Therefore, those factors affect the polycrystalline silicon through the metal portion thereon, which results in the variation of the resistance, and the factors vary depending on an area of an upper portion, i.e., the second metal portion. Thus, it is found that the resistance is varied owing to the area of the second metal portion.

Figure 3:
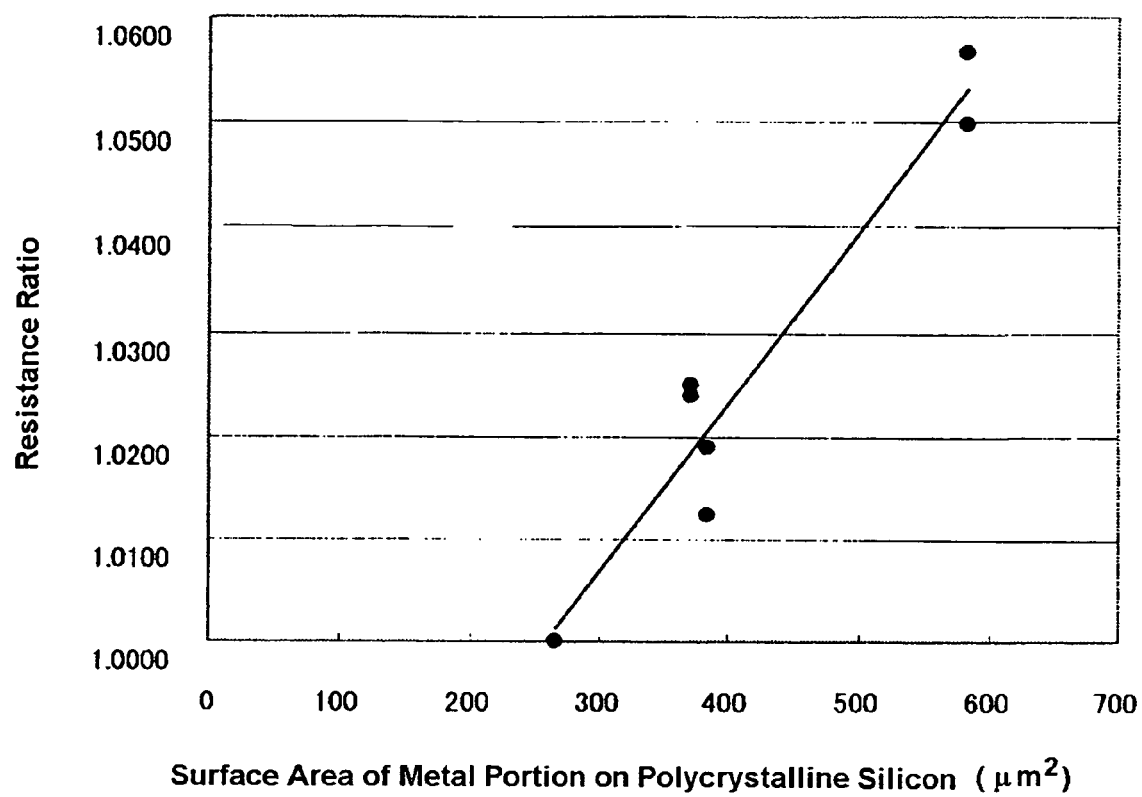
FIG. 3 is a graph showing a relationship between a surface area of a second metal portion and a resistance ratio.

FIG. 3 is a graph showing that, on an assumption that the resistance of the polycrystalline silicon resistor is set to 1, a ratio (specifically, resistance ratio) depends on the area of the second metal portion. It is apparent from FIG. 3 that the area of the second metal portion and the resistance of the polycrystalline silicon resistor have a proportional relationship. Accordingly, an increase in the area of the second metal portion can increase the resistance.

The present invention adopts a method of varying the area of the low concentration impurity region to thereby obtain the constant resistance by using the relationship. To be specific, in a case of increasing the resistance due to an excessive increase in the area of the second metal portion, a length of the low concentration impurity region in a longitudinal direction (i.e., a direction in which the high concentration impurity regions at both ends are connected) is reduced to lower the resistance Examples of methods other than the above-mentioned method include a method of varying a width of the resistor and that of varying a concentration in the low concentration impurity region, but those methods are not adopted in the present invention. This is because a use of the method of varying the width of the resistor impairs continuity in shape of the resistors, which causes shape variation during an etching process of the polycrystalline silicon. For the same reason, the resistance is not adjusted by varying dimensions of the resistor in the longitudinal direction. In addition, a method of varying the concentration of the low concentration impurity region for each resistor is not adopted because a use of the method leads to increase in number of steps to raise a manufacturing cost.

The present invention is characterized in that the variation of the resistance is corrected without varying the shape and an occupied area by the resistor.

Embodiment

FIG. 3 shows that an increase in area of the second metal portion by 50 μm$^2$ increases the resistance ratio by 1%. This establishes an expression described below.

It is assumed that the resistance ratio desired to be increased is a %, the area of the second metal portion is A, the area of the low concentration impurity region before varying the area is B, and the area of the low concentration impurity region which is varied for varying the resistance ratio is X1. In order to increase the resistance ratio by a %, 50 multiplied by a is added to A. The area of the second metal portion is, however, not varied in the present invention. Therefore, an equation (A+50·a): B=A: X1 holds, and X1 is expressed by the equation X1=A·B/(A+50·a). Further, in the present invention, a length L of the low concentration impurity region in a longitudinal direction is varied, thereby varying the area. When the area of the low concentration impurity region is expressed by the equation X1=(width W)·(length L1 in the longitudinal direction which is varied for varying the resistance ratio), the length L1 in the longitudinal direction which is varied for varying the resistance ratio is obtained as L1=X1/W.

Further, in a case of reducing the resistance ratio by a %, an area X2 of the low concentration impurity region which is varied for varying the resistance ratio establishes X2=A·B/(A−50·a), and therefore a length L2 in the longitudinal direction which is varied for varying the resistance ratio is obtained as L2=X2/W.

Figure 2A:
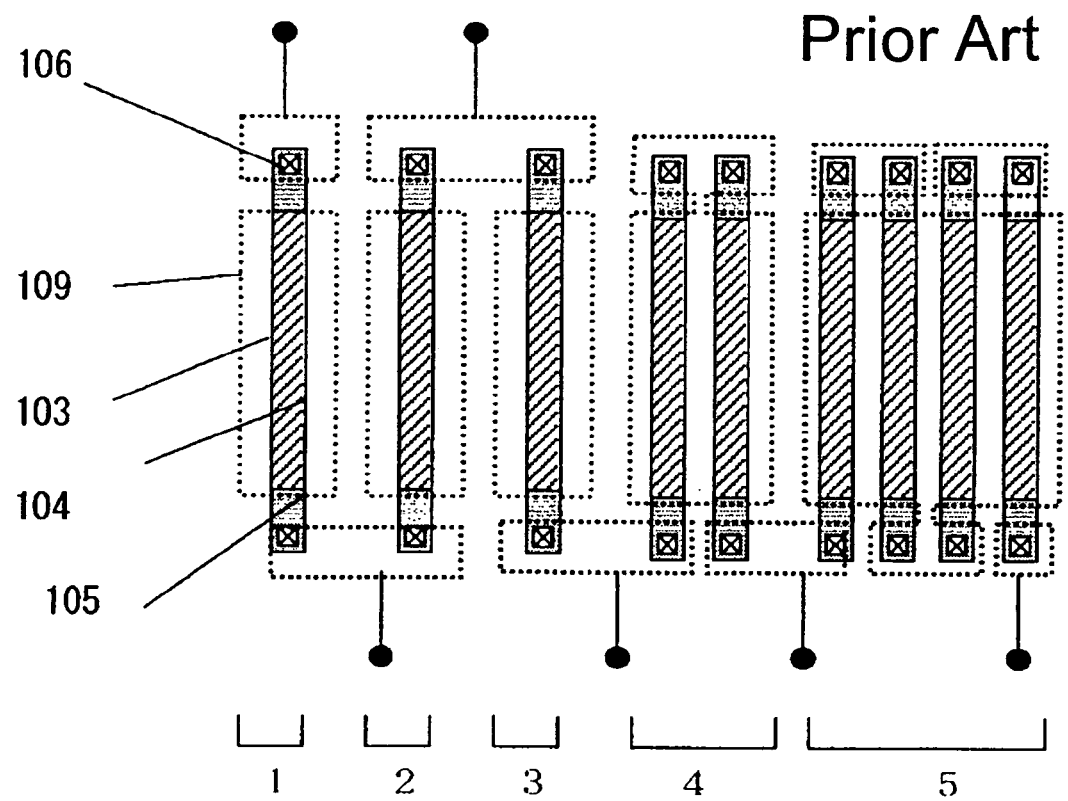
FIG. 2A is a schematic plan view of a conventional polycrystalline silicon resistor circuit.
Figure 2B:
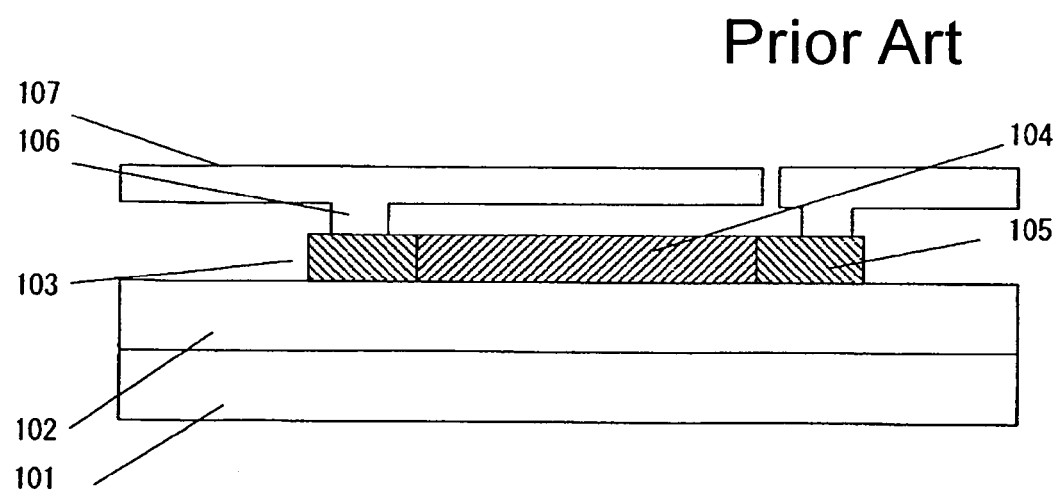
FIG. 2B is a schematic sectional view of the conventional polycrystalline silicon resistor circuit.

The length of the low concentration impurity region is determined as the length L1 or L2 to thereby obtain the constant resistance ratio. For example, in a case of a resistor circuit having a structure as shown in FIG. 2B, a resistance of a resistor group 5 having the largest metal area is increased by about 4% as compared with a resistor group 1. Further, a resistance of a resistor group 4 is increased by about 2% as compared with the resistor group 1. In order to correct the increases of the resistances, in this embodiment shown in FIG. 1, the length of the low concentration impurity region of the resistor group 5 and that of the resistor group 4 in the longitudinal direction are reduced by 4% and 2%, respectively, which realizes improvement of ratio accuracy of the resistor circuit. Note that in FIG. 1, the length of the low concentration impurity region 103 is not based on the above-mentioned numerical values for the sake of clarity.

It goes without saying that a low concentration impurity region of a certain resistor group should be covered with a metal portion in order to suppress variation of a resistance due to diffusion of hydrogen into polycrystalline silicon in a semiconductor manufacturing process.

What is claimed is:

1. A semiconductor device, comprising:
    a semiconductor substrate;
    at least one resistor disposed on the semiconductor substrate, and made of polycrystalline silicon, each of the at least one resistor having a low concentration impurity region and a high concentration impurity region, the low concentration impurity region having a resistance and a resistivity; and
    a metal portion provided to extend above the at least one resistor so as to cover at least the low concentration impurity region of the at least one resistor, the low concentration impurity region being affected by presence of the metal portion to change its resistivity,
    wherein an area of the low concentration impurity region of the at least one resistor is modified according to an area of the metal portion such that the low concentration impurity region remains constant in its resistance before and after the change of the resistivity of the low concentration impurity region caused by the metal portion, and
    wherein the area of the low concentration impurity region after the modification thereof is a linear function of the area of the low concentration impurity region before the modification thereof having a slope which is a ratio of the area of the metal portion to the area of the metal portion adjusted with a value derived from a linear function defined between the resistivity of the low concentration impurity region and the area of the metal portion.

2. The semiconductor device according to claim 1, wherein the linear function defined between a changed resistivity of the low concentration impurity region and an changed area of the metal portion is such that the area of the low concentration impurity region is reduced by 1% when the area of the metal portions is larger by 50 $\mu m^2$.

3. The semiconductor device according to claim 1, wherein there are a plurality of resistors.

4. The semiconductor device according to claim 1, wherein the metal portion has a potential fixed to be identical to a potential of the at least one resistor immediately below the metal portion.

5. The semiconductor device according to claim 1, wherein the at least one resistor is affected by presence of the metal portion to change its resistivity without varying the area of the at least one resistor.

6. The semiconductor device according to claim 3, wherein a sum of a length of the low concentration impurity region and a length of the high concentration impurity region is the same for all of the resistors.

7. The semiconductor device according to claim 1, further comprising a first insulating film disposed on the semiconductor substrate, wherein the at least one resistor is disposed on the semiconductor substrate via the first insulating film.

8. The semiconductor device according to claim 7, further comprising a second insulating film disposed on the at least one resistor.

9. The semiconductor device according to claim 3, further comprising a second metal portion connecting the plurality of resistors in series.

10. The semiconductor device according to claim 9, wherein the metal portion and the second metal portion are formed simultaneously.

11. The semiconductor device according to claim 1, wherein the area of the low concentration impurity region after the modification thereof is expressed by the following linear function:

$$X1 = A/(A+50a) \times B$$

where
    X1 is the area of the low concentration impurity region after the modification thereof,
    B is the area of the low concentration impurity region before the modification thereof,
    A/(A+50a) is the slope of the linear function between the areas of the low concentration impurity region after and before the modification thereof,
    A is the area of the metal portion,
    50a is the value derived from the linear function defined between the resistivity of the low concentration impurity region and the area of the metal portion, and
    a is a change in the resistivity of the low concentration impurity region caused by the metal portion.

12. The semiconductor device according to claim 1, wherein when the low concentration impurity region has a width which is constant along its length, the area of the low concentration impurity region is represented by a length of the low concentration impurity region.

* * * * *